United States Patent
McElfresh et al.

(10) Patent No.: US 7,800,385 B2
(45) Date of Patent: Sep. 21, 2010

(54) APPARATUS AND METHOD FOR TESTING ELECTRICAL INTERCONNECTS

(75) Inventors: David K. McElfresh, San Diego, CA (US); Dan Vacar, San Diego, CA (US); Robert H. Melanson, San Diego, CA (US); Leoncio D. Lopez, Escondido, CA (US)

(73) Assignee: Oracle America, Inc., Redwood City, CA (US)

( * ) Notice: Subject to any disclaimer, the term of this patent is extended or adjusted under 35 U.S.C. 154(b) by 139 days.

(21) Appl. No.: 12/048,085

(22) Filed: Mar. 13, 2008

(65) Prior Publication Data
US 2009/0230976 A1 Sep. 17, 2009

(51) Int. Cl.
*G01R 31/02* (2006.01)
(52) U.S. Cl. ...................................... 324/757
(58) Field of Classification Search ......... 324/754–765, 324/538
See application file for complete search history.

(56) References Cited

U.S. PATENT DOCUMENTS

| | | | | |
|---|---|---|---|---|
| 6,535,005 | B1* | 3/2003 | Field | 324/755 |
| 6,933,853 | B2* | 8/2005 | Barr et al. | 340/653 |
| 2003/0090273 | A1* | 5/2003 | Hauptner et al. | 324/533 |
| 2004/0155241 | A1* | 8/2004 | Cheng et al. | 257/48 |
| 2005/0088195 | A1* | 4/2005 | Grilletto | 324/765 |

* cited by examiner

*Primary Examiner*—Ha Tran T Nguyen
*Assistant Examiner*—Arleen M Vazquez
(74) *Attorney, Agent, or Firm*—Gregory P. Durbin; Polsinelli Shughart PC

(57) ABSTRACT

A test system including a package with interconnect paths. The package may have electrical paths that are electrically connected by the interconnect paths. The electrically connected electrical paths may yield increased data without significantly increasing the required testing hardware.

20 Claims, 7 Drawing Sheets

APPARATUS AND METHOD FOR TESTING ELECTRICAL INTERCONNECTS

FIELD OF THE INVENTION

The present invention generally relates to the testing of electrical assemblies and more specifically to a test system with interconnected test paths.

BACKGROUND

Electrical assemblies include a printed circuit board and a package, such as an integrated circuit, electrically connected to the printed circuit board. The electrical connection between the printed circuit board and the package is often made with an interposer or socket, which may be inserted between the printed circuit board and the package. The interposer allows the printed circuit board and the package to electrically connect to one another through the interface connections on the interposer. The electrical connection, via the interposer interface connections, between the printed circuit board and the package may be a point-to-point connection.

Factors, such as manufacturing defects, degrading interfaces and degrading materials may cause an electrical assembly to fail. The quality and robustness of the electrical assembly may be monitored for failures and also monitored to determine the faults causing the failures. Further, an electrical assembly may be tested for characterization purposes. One factor that may cause a fault in an electrical assembly is the degradation of interposer connections. The degradation of interposer connections may be monitored for shifts in electrical values. Another factor that may cause faults in an assembly is the degradation of materials such as the material used for solder joints. The material degradation may also be detected by monitoring shifts in electrical values.

Currently, the increasing complexities of electronic assemblies are placing increasing demands on test system methods, from both mechanical and electrical standpoints. For example, it is not uncommon for current electronic systems to include integrated circuits with a very large number of contact points. While it may not be necessary to test each and every contact point, the mere fact that the contact points are increasing typically means an increase in the number of points that must be tested in order to effectively test the electronic system. Accordingly, the equipment cost and the complexity of testing increases as the number of test points increases. Further, the number of interposer connections or solder joints is increasing with the number of contact points on the integrated circuit. As a result, testing is increasingly difficult as the number of interposer interface connections or solder joints is significantly increasing and the number of test nodes available for test equipment connection is not significantly increasing. The result is a number of interposer interface connections or solder joints cannot be directly tested, making it difficult to determine the point or points of degradation. Further, characterization of the electrical assembly also becomes more difficult.

Accordingly, there is a need in the art for an improved test system and increased granularity of test data points in the test system. As will be recognized from the discussion below, these and other problems in the art are addressed by various systems and methods conforming to aspects of the present invention. Before explaining the disclosed embodiments in detail, it is to be understood that the invention is not limited in its application to the details of the particular arrangement shown, because the invention is capable of other embodiments. Moreover, aspects of the invention may be set forth in different combinations and arrangements to define inventions unique in their own right. Also, the terminology used herein is for the purpose of description and not of limitation.

SUMMARY

Generally, one aspect of the present invention involves a system for testing electrical assemblies. The system comprises a printed circuit board, a package and a plurality of electrical connections. The plurality of electrical connections electrically connect the printed circuit board to the first package. The system also involves a set of electrical paths providing electrical communication between the printed circuit board and the package. The set of electrical paths includes at least a first electrical path and a second electrical path and a set of interconnect paths electrically connecting individual paths of the first set of paths. The set of interconnect paths includes at least one interconnect path electrically connecting the first electrical path and the second electrical path.

Another aspect involves a method of testing an electrical system. The electrical system comprises providing a printed circuit board, providing a package, providing a plurality of electrical connections. The plurality of electrical connections electrically connect the printed circuit board to the package. The system also comprises providing a set of electrical paths which providing electrical communication between the printed circuit board and the package. The set of electrical paths includes at least a first electrical path and a second electrical path and provides a set of interconnect paths electrically connecting individual paths of the first set of paths. Additionally, the set of interconnect paths includes at least one interconnect path electrically interconnecting the first electrical path and the second electrical path.

Still another aspect involves a test method comprising generating a first matrix from a set of linear equations. The set of linear equations represents at least a first electrical path, a second electrical path and a third electrical path. The first electrical path includes at least a first and a second segment and the second electrical path includes at least a third and a fourth segment. The third electrical path comprises at least one segment from the first electrical path and at least one segment from the second electrical path. The test method also measures electrical quantities of the first electrical path, the second electrical path and the third electrical path. Additionally, the test method generates a second matrix comprising the electrical quantities of at least the first electrical path, the second electrical path, and the third electrical path, solves a third matrix using the first matrix and the second matrix. The third matrix includes determined values corresponding to each of the segments of the electrical paths. Further, the test method identifies a value in any one of the first segment, the second segment, the third segment and the fourth segment using at least one of the second matrix and the third matrix.

It should be noted that embodiments of the present invention may be used in a variety of test systems or electrical assemblies, including printed circuit board assemblies. The embodiment may include a variety of boards, interposers, assemblies with solder joints and packages. The present invention may be used with practically any apparatus related to packaging or any apparatus that may contain an electrical assembly, an integrated circuit, die, substrate, interconnect material or interposer. Accordingly, embodiments of the present invention may be employed in computer equipment packaging and/or peripherals, and electronics device with an integrated circuit or die and so on.

These and other advantages and features of the present invention will become apparent to those of ordinary skill in the art upon reading this disclosure in its entirety.

DETAILED DESCRIPTION OF EMBODIMENTS

Figure 1A:
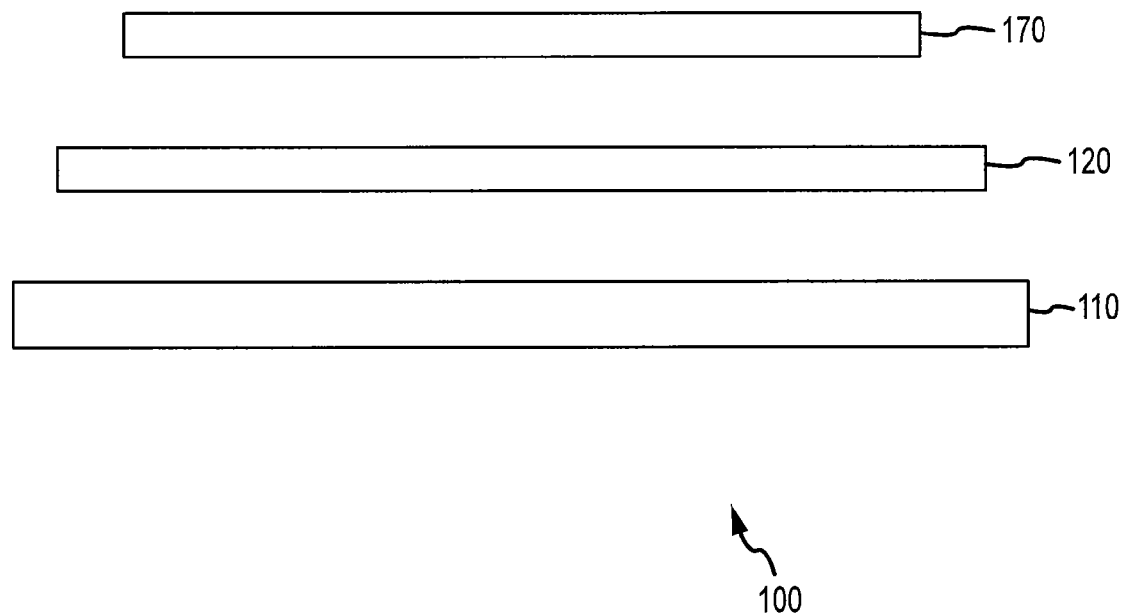
FIG. 1A depicts a cross section of an electrical assembly.

One embodiment of the present invention includes a test system with interconnect paths. The test system in this embodiment includes a test package with interconnect paths that electrically connect electrical paths, thereby dramatically increasing the number and accuracy of identifiable and locatable fault locations as well as increasing the ability to characterize the test package. The electrical paths may be configured such that in the absence of the interconnect paths, the electrical paths would be electrically isolated from one another. The electrically interconnected paths allow for a greater yield of data, both measured and determined, without significantly increasing the number of test nodes and without significantly increasing the amount of required test hardware.

In testing for failures caused by factors such as, but not limited to, the degradation of interface connections or material degradation, the test hardware may connect to the electrical assembly via test nodes. The test nodes may be located at each end of the individual electrical paths. In one example, the electrical path electrically begins at one test node, then connects the printed circuit board and the package via interface connections. After connecting the printed circuit board and the package, the electrical path then terminates at a second test node. Thus, the electrical path passes through at least two interface connections. An electrical path that passes through two interface connections may yield data regarding the two interface connections when tested. One drawback of current approaches is that the number of interface connections available for testing far outnumbers the number of test nodes available for connection to test equipment. For example, when testing for failures in an electrical assembly with the printed circuit board soldered to the daisy chain package, the number of interface connections for testing may far outnumber the number of test nodes available for test equipment connection. In one embodiment, the number of interface connections for testing may outnumber the number test nodes available for test equipment connection by several magnitudes.

A package may be a test package such as, but not limited to, a daisy chain package. A daisy chain package may be located adjacent to a printed circuit board or may also be located adjacent to an interposer. In one embodiment, a test package may include a daisy chain package and a printed circuit board that are designed to be used together in the electrical assembly. Further, a daisy chain board may be located adjacent to a package or may also be located adjacent to an interposer. Daisy chain packages or daisy chain boards may include segments of electrical paths or daisy chains where the segments of electrical paths or daisy chains may be comprised of low resistance material. The daisy chain package or the daisy chain board may include a segment of an electrical path, where the electrical path in its entirety may be connected at each end to at least two nodes. A first individual node may be located at one end of an electrical path and a second individual node may be located at the other end of the electrical path. Electrical paths may be used for measuring various electrical characteristics such as, but not limited to, resistance, impedance, signal integrity, current, voltage and so on and additionally as discussed in U.S. patent application Ser. No. 12/048,143 titled "Apparatus and Method for Testing Electrical Interconnects with Switches", filed on Mar. 13, 2008, which is herein fully incorporated by reference. Accordingly, the electrical characteristics may be direct current quantities and alternating current quantities.

In another embodiment, measurements, such as resistance or impedance, may be determined for electrical path segments, where the electrical path segment is not directly measured. The electrical quantities set forth in this example are for explanatory purposes as other electrical quantities may be measured as well. In one example, test paths including at least two segments of different interconnected electrical paths may be established. A set of linear equations may then be created from the test paths and a first matrix may be generated from the linear equations. Next, electrical values, such as resistance or impedance, may be measured for the set of test paths and a second matrix may be created using this set of electrical measurements. Then using both the first matrix generated from the linear equations and the second matrix generated from the set of electrical measurements, it may be possible to solve for a third matrix of resistances. The individual values of the third matrix of determined electrical values may correspond to the individual segments of the measured test paths. Stated differently, an electrical value may be determined for each of the individual test path segments that are not measured individually, by creating representative matrices and using these matrices to solve for electrical values using linear algebra.

It should be noted that embodiments of the present invention may be used in a variety of test systems or electrical assemblies, including printed circuit board assemblies. The embodiment may include a variety of boards, interposers, assemblies with solder joints and packages. The present invention may be used with practically any apparatus related to packaging or any apparatus that may contain an electrical assembly, an integrated circuit, die, substrate, interconnect material or interposer. Accordingly, embodiments of the present invention may be employed in computer equipment packaging and/or peripherals, and electronics device with an integrated circuit or die and so on.

FIG. 1A depicts a cross section of possible elements of an assembly 100. The assembly 100 may be a printed circuit board assembly or any other type of assembly such as a central processing unit assembly. The assembly 100 may include a printed circuit board 110, an interposer 120 and a test package 170. The printed circuit board 110 may also be a test board such as a daisy chain board. In FIG. 1A, the printed circuit board 110, interposer 120 and test package 170 as shown, are physically separated from one another, however, this figure is provided only for explanatory purposes.

Figure 1B:
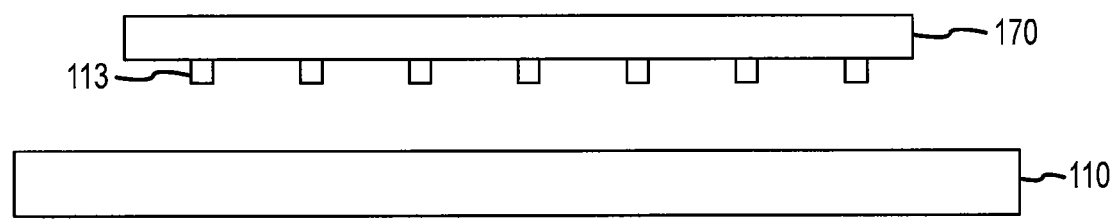
FIG. 1B depicts a cross section of another electrical assembly.

In another embodiment including the elements of FIG. 1A, the printed circuit board 110, interposer 120 and test package 170 may be electrically or operationally connected to one another. For purposes of this example, the test package 170 will be referred to as the daisy chain package 170. The printed circuit board 110 may be connected to the daisy chain package 170 via a point-to-point connection. For example, in assembly 100, printed circuit board 110 may be electrically connected to daisy chain package 170. Positioning interposer 120 between the printed circuit board 110 and daisy chain package 170 may electrically connect the printed circuit board 110 and daisy chain package 170. Further, interposer 120 may have interface connections that allow the interposer 120 to form an electrical connection between the printed circuit board 110 and daisy chain package 170. Further, the interface connections on interposer 120 may electrically connect the printed circuit board 110 to the interposer 120 with an interface point on the board side. Similarly, the interface connections on interposer 120 may electrically connect the interposer 120 to the package 170 with an interface point on the package side. For purposes of the discussion herein, interface connections may have an interface point on the board side and on the package side. Further, an assembly with a printed circuit board, and a package (omitting the interposer) may have interface connections that electrically connect the printed circuit board with an interface point on the board side and the package with an interface point on the package side. The connection between the daisy chain package 170, the interposer 120 and printed circuit board 110 may be a point-to-point connection. The interposer 120 will be discussed in more detail below. It is also possible to electrically connect the printed circuit board 110 and the daisy chain package 170 by soldering the daisy chain package 170 to the printed circuit board 110 as depicted in FIG. 1B. In FIG. 1B, the daisy chain package 170 may be soldered to the printed circuit board 110 and the solder joints may form an electrical connection between the printed circuit board 110 and the daisy chain package 170. In FIG. 1B, the printed circuit board 110 and daisy chain package 170 as shown, are physically separated from one another, however, this figure is provided only for explanatory purposes.

Surface mount packaging is one method of electrically connecting one or multiple electrical components to a printed circuit board. Surface mount packaging may also be used for electrical connections between integrated circuit packages, for example, and printed circuit boards. The electrical connection between the integrated circuit package and the printed circuit board may be made either by positioning an interposer between the printed circuit board and the integrated circuit package or by soldering the integrated circuit package to the printed circuit board. As shown in FIG. 1A, an interposer 120 may be used for an electrical connection between the daisy chain package 170 and the printed circuit board 110.

An electrical assembly may be tested for a number of reasons including manufacturing issues, reliability or for characterization purposes. Shifts in electrical values may indicate early failure issues and accordingly electrical assemblies may be tested and measured over time to evaluate the stability or robustness of an electrical assembly. For example, the interface connections or interconnect material may be subject to degradation and this interconnect degradation may be tested for product reliability purposes. It is possible for the interconnect degradation or the quality of the electrical connections to change over time and this change may be reflected in various electrical measurements. For at least this reason, the reliability and robustness of the electrical connections formed by the interface connections may be monitored. Accordingly, it may be desirable to monitor the quality of the interface connections over a period of time. Further, any number of electrical quantities including, but not limited to, resistance, signal integrity, impedance, voltage or current may be monitored.

Industry trends of product miniaturization include product revisions such as decreasing the size of packages and also decreasing the size of the contacts on the packages. Due to this product miniaturization, the number of electrical connection points between components such as interface connections on an interposer or solder joints, may increase. (It is also possible for the packages to increase in size even though the connection points are decreasing in size.) Accordingly, the number of interface connections that may be tested for performance degradation may also increase. Further, the number of test nodes available for test equipment connection may limit the amount of test data. For example, the number of interconnects between the printed circuit board and the package to be tested may be far greater than the number of test nodes available for connection to test equipment. Various testing methods will be discussed in greater detail below with respect to FIGS. 2-5.

One method of testing interface connections may be to position a test package adjacent to the interposer. This test package may be, but is not limited to, a daisy chain package. For purposes of this discussion, the test package will be referred to as a daisy chain package 170. The electrical paths and daisy chain packages will be discussed in greater detail below with respect to FIGS. 2-5. Another method of testing interface connections may be to position a test package adjacent to the printed circuit board as depicted in FIG. 1B.

As depicted in FIG. 1A, the daisy chain package 170 may be located adjacent to the interposer 120. However, as depicted in FIG. 1B, the daisy chain package 170 may also be located adjacent to the printed circuit board 110. In FIG. 1B, the electrical connections may be solder joints 113 when the daisy chain package 170 is located adjacent to the printed circuit board 110. The location of the test nodes may also vary and may depend on the location of the daisy chain package 170. Many of the examples discussed herein locate the test nodes adjacent to the printed circuit board for explanatory purposes and is not meant as a limitation on the system. Test nodes will be discussed in greater detail below with respect to FIG. 2. Further, numerous examples discussed herein locate the daisy chain package adjacent to the interposer, however, and not a limitation on the system.

Figure 2:
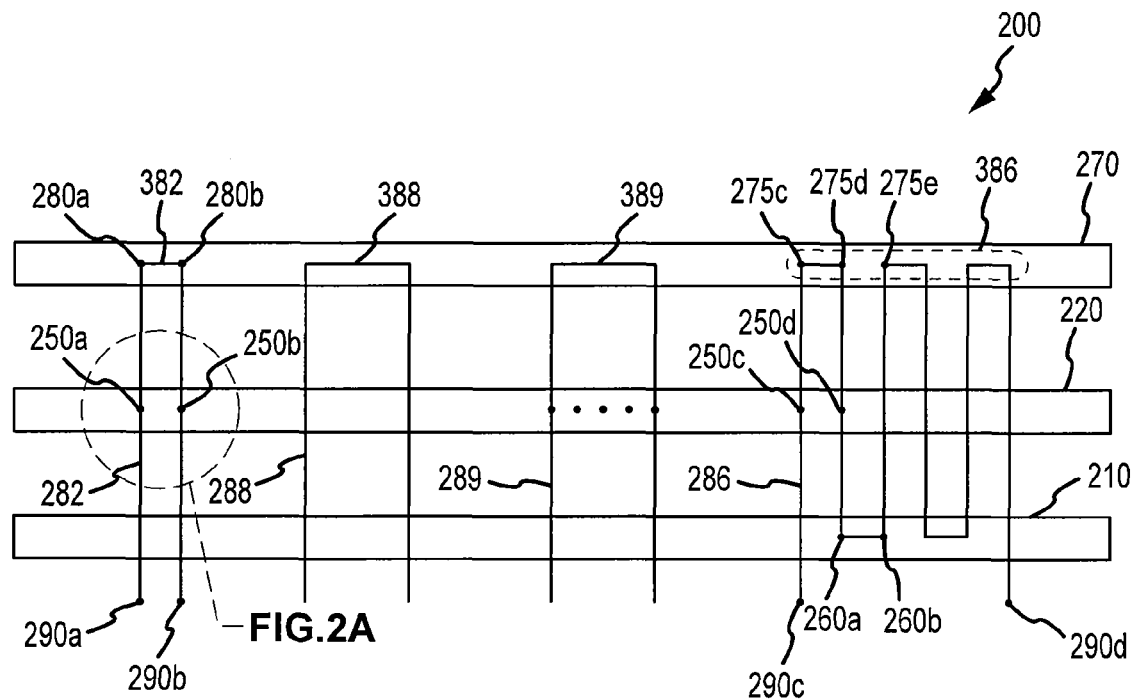
FIG. 2 depicts a cross section of an electrical assembly, including a set of electrical paths connected to test nodes.

FIG. 2 depicts one embodiment of a cross section of a processing assembly 200, including a daisy chain package 270, an interposer 220, a printed circuit board 210, and examples of various electrical paths, where the ends of the electrical paths connect to test nodes. Generally, an electrical path (282, 286, 288, 289), such as electrical path 282, may begin at a first test node 290a, continue to the printed circuit board 210, to the interposer 220, making electrical contact through an interface connection 250a on the interposer 220, where the interface connection 250a electrically connects the printed circuit board 210 to the interposer 220. Then, the electrical path continues to a contact point 280a on the daisy chain package 270, where the interposer 220 is electrically connected to the daisy chain package 270 via an interface connection 250a on the interposer 220. The electrical path continues on the daisy chain package 270 from one contact point 280a to another contact point 280b on the daisy chain package 270 and then continues back to the interposer 220, electrically connecting the interposer 220 to the daisy chain package 270 through an interface connection 250b, then to the printed circuit board 210. The electrical path ends at a second test node 290b.

Figure 2A:
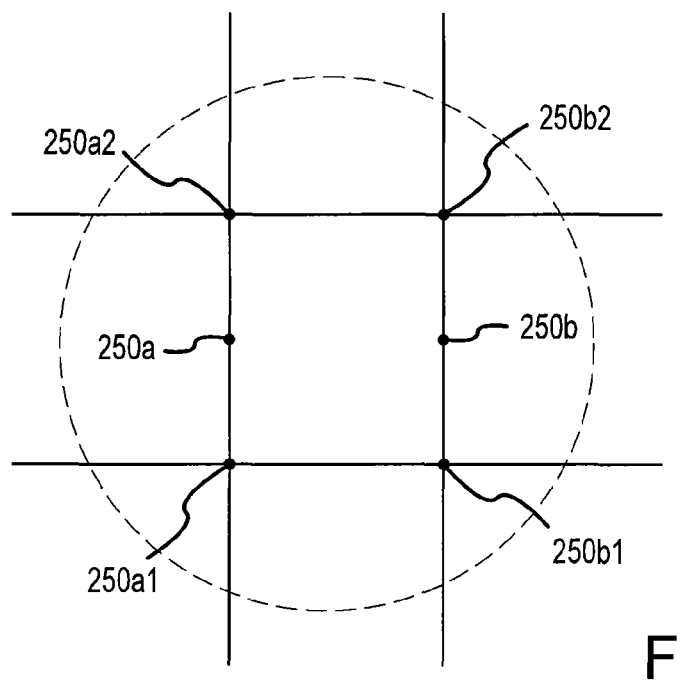

FIG. 2A depicts an enlarged view of part of an interposer connection in FIG. 2. Much of the discussion herein relates to electrical paths that electrically connect a printed circuit board to an interposer through an interface connection and that also electrically connect a daisy chain package to an interposer through an interface connection. For example, as previously discussed with regard to electrical path 282, interface connection 250*a* on the interposer 220 electrically connects interposer 220 to the printed circuit board 210 and interface connection 250*a* on the interposer 220 also electrically connects interposer 220 to the daisy chain package 270. However, interface connections, such as the interposer interface point or interface connection 250*a*, include two interface points. As depicted in FIG. 2A, the electrical path 282 electrically connects the printed circuit board 210 to the interposer 220 at a first interface point 250*a*1 and electrically connects the interposer 220 to the daisy chain package 270 at a second interface point 250*a*2. Additionally, the interposer interface point or interface connection 250*b* includes two interface points, a first interface point 250*b*2 that electrically connects the daisy chain package 270 to the interposer 220 and a second interface point 250*b*1 that electrically connects the interposer 220 to the printed circuit board 210. Furthermore, any reference herein, to an interface connection, interconnect point or interposer interface point may include two interface points, a first interface point on the board side (including printed circuit boards, daisy chain boards, test boards and so on) and a second interface point on the package side (including test packages such as daisy chain packages). Moreover, the discussion relating to any type of path that passes through at least two interface connections may include passing through at least four interface points, each interface connection including a first interface point on the side of the board and a second interface point on the side of the package. Further, electrical connections that are comprised of materials such as solder also include a first interface point on the side of the board and a second interface point on the side of the package.

In FIG. 2, electrical path 282 appears as a short electrical path. A short electrical path may be an electrical path that passes through two interface connections. Additionally, an electrical path may be a short path if the resolution of the data may be narrowed to determine the data for two interface connections. Thus, when a short path is tested, the test yields data for two interface connections or the data may be determined for two interface connections. For example, if a fault occurs in a short electrical path the fault may be located at one of the two interface connections, such as 250*a* or 250*b*, in the short electrical path.

In a second example, an electrical path 288 may follow an electrical path that passes through two adjacent interposer interface connections, but in this example, the two adjacent interposer interface connections may be physically located several interposer interface connection intervals from one another. Electrical path 288 may appear similar to electrical path 289 (discussed below) when viewed from a top view because the contact points on the daisy chain package may be the same distance apart. However, electrical path 288 is electrically connecting two adjacent interposer interface connections as opposed to electrical path 289 that electrically connects two interposer interface connections that have several unconnected interface connections located between the two electrically connected interface connections. Accordingly, adjacent interposer connections do not necessarily correspond to short or long electrical paths or daisy chains. Stated differently, the proximity of two connections on the interposer or two solder joints do not necessarily reflect the length of the electrical path or daisy chain.

In a third example, electrical path 286 may follow an electrical path that traces between the daisy chain package 270 and the printed circuit board 210 multiple times. In this example, the electrical path may start at a first test node, 290*c* follow an electrical path through the printed circuit board 210 to the interposer 220, where the interposer interface connection 250*c* electrically connects the interposer 220 to the printed circuit board 210, and then to the daisy chain package contact point 275*c*. After connecting at least two daisy chain package contact points 275*c*, 275*d*, the electrical path may continue to an interposer interface connection 250*d*, to a connection point 260*a* on printed circuit board 210 to another printed circuit board connection point 260*b*, then connect to another interposer interface connection 250*e* and then return to another daisy chain package contact point 275*e*. Continuing this example, the electrical path may continue to trace multiple times between the printed circuit board connection points and the daisy chain package contact points and terminate at a second test node 290*d*. As discussed previously, interposer interface connections 250*c* and 250*d* may include four interface points. Interposer interface connection 250*c* includes a first interface point on the side of the printed circuit board 210 and a second interface point on the side of the daisy chain package 270. Similarly, interposer interface connection 250*d* includes a first interface point on the side of the printed circuit board 210 and a second interface point on the side of the daisy chain package 270.

In FIG. 2, electrical path 286 from a side view appears as a long electrical path. A long electrical path may be a path that passes through multiple interposer interface connections, thus yielding aggregated data for multiple interposer interface connections. Additionally, electrical path 286 may appear from the top view (as in FIG. 3) as a series of individual short chains one after another, but may instead be one electrical path that traces between the daisy chain package 270 and the printed circuit board 210 multiple times.

The assembly 200 may contain multiple short electrical paths and multiple long electrical paths or any combination thereof. As discussed previously, a short electrical path may be, for example, a path that passes through two interposer interface connections and a long electrical path may be a path that passes through multiple interposer interface connections. When tested, the short electrical path may yield data for two interposer interface connections as opposed to a long electrical path that may yield aggregated data for multiple interposer interface connections. Accordingly, a short electrical path may allow a more accurate determination than a long electrical path of which interface connection or sets of interface connections may have caused a failure. For example, if there is a failure in a short electrical path, there are two possible interface connections or small set of interface connections of failure. If there is a failure in a long electrical path, the failure could have occurred at any one of multiple points or sets of points along the electrical path. Additionally, the assembly 200 is not limited to short and long electrical paths passing through interposer interface connections. The assembly 200 may also include short and long electrical paths that pass through interface connections, where the interconnects may be any type of material or component that allows an electrical connection such as, but not limited to, solder.

The assembly 200 could also be configured as an assembly with a daisy chain package 270 adjacent to the printed circuit board 210 as shown in FIG. 1B. In this embodiment of FIG. 2, the interposer 220 is omitted and the electrical connections are interconnected using material that allows electrical connections such as solder joints. The aforementioned electrical paths, 282, 286, 288, as well as other electrical paths, are also possible in this assembly configuration. Further, the assembly may be configured using a daisy chain board and may include the same type of electrical paths as the other configurations. Moreover, the interface connections may be any material, device, element or component that forms an electrical connection.

Even though the short electrical paths may increase characterization accuracy and the accuracy of determining the location of degraded interfaces, degraded materials or failures, test node constraints and equipment constraints make it physically unfeasible to design a test system with only short electrical paths. For example, there may be thousands of interface connections to be tested and only 60 test nodes available for test equipment connection. Taking these limitations into consideration, a test system configured in accordance with aspects of the present invention may test both long and short electrical paths and identify failure points along the paths. However, in conventional systems, when a measurement indicates some type of failure on a long electrical path, it may not be possible to tell which interconnect point or set of interconnect points was the fault point of the measurement. The electrical path configurations described throughout are not the only possible electrical path configurations, and instead are only examples set forth for explanatory purposes and not meant as limitations.

Figure 3:
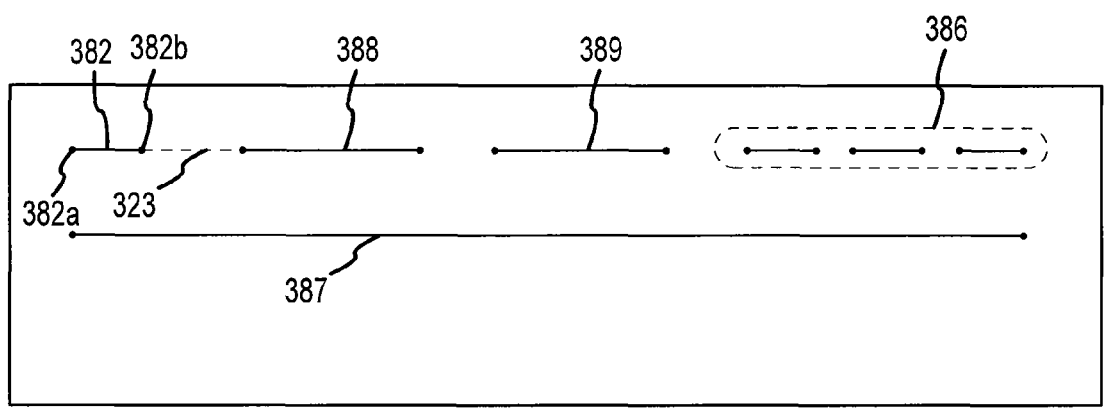
FIG. 3 depicts a top view of a daisy chain package with a plurality of electrical paths.

FIG. 3 depicts an example of a daisy chain package, illustrating segments of electrical paths and an example of an interconnect path. FIG. 3 depicts a top view of a daisy chain package where only segments of the electrical paths and interconnect path are visible. The interconnect path will be discussed in further detail below. The electrical path segments that are visible in FIG. 3 are the connections between contact pads on a daisy chain package. For example, electrical path segment 382 as shown in FIG. 3, may begin at a first test node, continue to the printed circuit board, to the interposer, to the daisy chain package. The part of electrical path segment 382 as shown in FIG. 3, is the next section of the electrical path where the electrical path contacts a first contact pad 382a on the daisy chain package and continues to a second contact pad 382b on the daisy chain package. Further, in another example, the electrical path segment as depicted in FIG. 3 on a daisy chain package, may also be depicted on a daisy chain board. Moreover, even though FIG. 3 discusses embodiments including an interposer, other embodiments omit the interposer and instead, the electrical connections may be formed using various materials such as solder. Furthermore, the segments of electrical paths in FIG. 3 are depicted as tracing horizontally, but the electrical paths and accordingly segments of electrical paths may also trace vertically, diagonally or any direction or any combination thereof. For example, an electrical path may trace the perimeter of the daisy chain package, tracing both horizontally and vertically across the daisy chain package.

As shown in FIG. 3, there may be long electrical path segments 386 and short electrical path segments 382. In FIG. 3, it is possible for a long electrical path segment, such as electrical path segment 386, to appear as a series of short path segments. However, electrical path 386, in its entirety, may electrically connect a greater number of interposer interface connections then the number of interposer interface connections connected by electrical test path 382 in its entirety. Further, in FIG. 3, an electrical path segment, such as electrical path segment 387, may appear to be a long path segment, but instead be a short path segment as it passes through two interface connections. In another example (not shown in FIG. 3), a long electrical path may pass through two adjacent interface connections, where the first interface connection of the electrical path and the last interface connection of the electrical path are adjacent, but pass through several interface connections along the electrical path. Continuing the example, the electrical path may begin at a first test node, connect to the printed circuit board at an interface connection located along the bottom of the interposer, then continue to the daisy chain package. On the daisy chain package, the electrical path may serpentine along the bottom perimeter of the package, from left to right, continue up the right perimeter of the package, from bottom to top, continue along the top perimeter of the daisy chain package, from right to left, then continue down the perimeter of the daisy chain package from top to bottom, then continue left to right along the bottom perimeter of the package. The electrical path may then continue to the interposer to pass through an interface connection adjacent to the first interface connection of the electrical path, then continue to the printed circuit board and terminate at a second test node. As discussed with respect to FIG. 2, short paths may yield test data for two interface connections and long paths may yield aggregated test data for multiple interface connections. Additionally, the interface connections may be solder joints as well as interposer interface connections, however, interposer interface connections are used herein for explanatory purposes and not for purposes of limitation.

In FIG. 3, even though only a segment of the electrical path is shown, the electrical path segment 386 in its entirety (including parts of the electrical path not displayed in FIG. 3), is similar to electrical path 286 in FIG. 2. In FIG. 3, the electrical path 386 in its entirety (the entire electrical path is not shown in FIG. 3), may begin at a test node, continue through the printed circuit board, to the interposer, where the interface connections of the interposer electrically connect the printed circuit board to the interposer, then continue to a contact point on the daisy chain package. The path may then continue across to another contact point on the daisy chain package, to an interposer interface connection, to a printed circuit board connection point over to another printed circuit board connection point, to another interposer interface connection and then back to a contact point on the daisy chain package, over to another contact point on the daisy chain package and back to the interposer interface, to a printed circuit board connection point and so on. The serpentine path between the printed circuit board and the daisy chain package may include one iteration, or as many iterations as necessary to yield the relevant test data.

FIG. 3 also depicts an interconnect path 323, shown in a dotted line. Conventionally, electrical paths in an assembly are electrically isolated from one another. For example, disregarding the dotted interconnect path 323, electrical path segment 382 would be electrically isolated from electrical path segment 388, electrically isolated from electrical path segment 389 and electrically isolated from all other electrical paths on the daisy chain package. However, in FIG. 3, interconnect path 323 electrically connects electrical path segment 382 to electrical path segment 388. Interconnect paths may electrically connect electrical paths on the daisy chain package or the interconnect paths may electrically connect electrical paths on a daisy chain board. An exemplary embodiment locates the interconnect paths on a daisy chain package and includes the interconnect paths functioning as shorts between the electrical paths. Additionally, modifying the interconnect paths may be less difficult when the interconnect paths are located on the daisy chain package as opposed to when the interconnect paths are located on the daisy chain board. Furthermore, one interconnect path may interconnect two electrical paths, or multiple interconnect paths may connect two electrical paths or multiple interconnect paths may interconnect multiple electrical paths or any combination thereof.

Interconnect paths may function as shorts between the electrical paths, or the interconnect paths may function as electrical paths themselves. Interconnect paths may function as electrical paths when they trace an electrical serpentine path between the daisy chain package and the printed circuit board. Also, when the interconnect paths function as electrical paths, the interconnect paths may have an electrical quantity such as impedance, resistance, or so on that may be determined. The effect of using interconnect paths, such as interconnect path segment 323, will be discussed in further detail with respect to FIG. 4. Moreover, an interconnect path functioning as an electrical path, that traces between the daisy chain package and the printed circuit board increases the possible number of test paths that may be measured. The result of the increased number of test paths is a better estimate of the uncertainty of the determination of the fault location causing the failure then a lower number of test paths. Additionally, the increased number of test paths may result in an increased ability to characterize the interface connections of the electrical assembly.

Still referring to FIG. 3, an electrical path, such as electrical path segment 389, may electrically pass through two interposer interface connections. The cross section of an electrical path segment 389 may look like electrical path 289 in FIG. 2. In one example, electrical path segment 389 begins at a first test node, continues through the printed circuit board to a first interface connection on the interposer and then to a contact point on the daisy chain package. The path then continues to the next contact point on the daisy chain package, returns to a second interposer interface connection, to the printed circuit board and ends at a second test node. In this example, the two interposer interface connections that the electrical path passes through may have several interposer interface connections between them that are not part of the electrical test path.

In the next example, the electrical path segment 387 may appear to be longer because of the length of the electrical path segment on the face of the daisy chain package. However, electrical path segment 387 may connect two interposer interface connections with a large distance between the two interposer interface connections. Generally, the length of an electrical test path may be dependent on a number of factors including, but not limited to, the reliability data sought for certain interposer interface connections or for the printed circuit board assembly in its entirety. A trade off may exist between the benefits of short and long chains. For example, if the electrical paths are long electrical paths, then the probability of finding a failure may increase, but the probability of being able to locate the failure may decrease. In another example, if the electrical paths are short electrical paths, then the probability of testing the location with the fault may decrease, but if a failure is detected then the probability of being able to locate the fault may increase.

Figure 4:
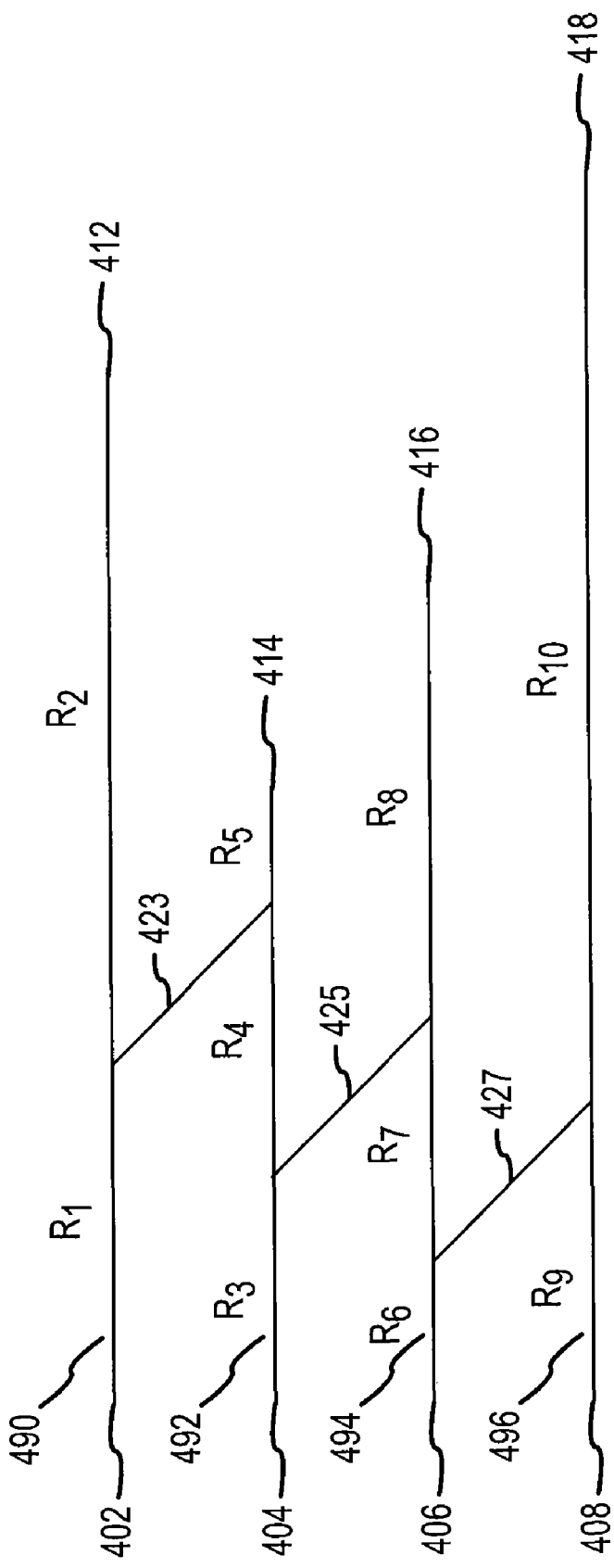
FIG. 4 depicts a representation of electrical paths that are electrically connected by interconnect paths.

FIG. 4 depicts a representation 400 of electrical paths that are electrically connected by interconnect paths conforming to aspects of the present invention. FIG. 4 includes representations of test nodes 402, 404, 406, 408, 412, 414, 416, 418, electrical paths 490, 492, 494, 496, interconnect paths 423, 425, 427, measurement paths R1, R2, R3, R4, R5, R6, R7, R8, R9, R10 and test paths. In FIG. 4, electrical path 490 is one representation of electrical path 282 in FIG. 2. Further, in FIG. 4, the electrical paths are depicted as straight lines, even though as shown in FIG. 2 the electrical paths may be configured in a serpentine pattern. Also, in FIG. 4, test nodes 402 and 412 are representations of test nodes 290a and 290b in FIG. 2. Further, in FIG. 4, interconnect path 423 is one representation of interconnect path 323 in FIG. 3.

In FIG. 4, electrical path 490 may electrically connect a printed circuit board, an interposer and a daisy chain package and the electrical path 490 may have test nodes located at each end. In FIG. 4, electrical path 490 is comprised of measurement paths R1 and R2. In FIG. 4, a first interposer interface connection may be located somewhere along the length of the electrical path segment, measurement path R1, and a second interposer interface connection may be located along the length of the electrical path segment, measurement path R2. The likelihood of locating or isolating a fault and associating the fault with a degraded interposer interface connection or degraded solder joint may be increased by locating interconnect paths such that the interconnect paths intersect the electrical paths between each of the interposer interface connections.

Measurement paths may be segments of electrical paths. Further, the end points of the measurement paths may be defined by test nodes or also may be defined where the interconnect path connects to the electrical path. Electrical paths also may have a test node at each end of the electrical path. Test paths may be comprised of multiple measurement paths. Further test paths may be comprised of multiple measurement paths, multiple interconnect paths and multiple electrical paths. Test nodes may also be located at each end of the test path. The test nodes 402, 404, 406, 408, 412, 414, 416, 418 may function as connection points for any type of equipment that may connect to the test nodes.

For example, one test path, of the various possible test paths, may start at test node 402 and may end at test node 416. In this example, the test path may continue from test node 402 along measurement path R1 to interconnect path 423. From interconnect path 423, the test path may follow measurement path R4 to interconnect path 425 to measurement path R8 and then end at test node 416. It is also not necessary for test paths to be comprised of multiple electrical paths and also not necessary for a test path to include an interconnect path. In another example, a test path may start at test node 402, continue from measurement path R1 to measurement path R2 and end at test node 412. Continuing the example, the test path is the same as electrical test path 490. The examples of test paths, measurement paths, interconnect paths, electrical paths and test nodes discussed herein are not meant to be limiting, and instead are set forth only as explanatory examples.

Furthermore, electrical components such as, but not limited to, diodes, capacitors and inductors may be inserted along a test path and also may be used to define a test path. For example, a capacitor may be inserted along a test path, such that the test path may electrically connect to and pass through the capacitor on the daisy chain package and the capacitor may function as a short at high frequencies or may additionally function as an open at low frequencies. By controlling the components, an increased number of test paths is possible. It may also be possible to locate the electrical components on the printed circuit board. One embodiment may include locating capacitors on the printed circuit board, daisy chain board or test board. Moreover, the electrical components may be used, for example, to replace an interconnect path, the electrical components may be placed in series or parallel with interconnect paths or the electrical components may be placed in series or parallel with interconnect paths functioning as electrical paths, the electrical components may be placed in series or parallel with other electrical components or any combination thereof. By using electrical components with electrical paths that are not reversible (for example, a diode may be used in this case), the number of test paths may be increased. Additionally, by using components with reversible electrical paths (for example, a transistor may be used in this case), the number of test paths may also be increased.

Each of the electrical paths 490, 492, 494, 496 may also have test nodes located at each end. For example, electrical path 490 may have test node 402 located at one end and test node 412 located at the other end, electrical path 492 may have test nodes 404 and 414 located at each end and so on. The interconnect paths 423, 425, 427 may connect the electrical paths 490, 492, 494, 496 to one another. For example, interconnect path 423 may electrically connect electrical path 490 to electrical path 492. Interconnect paths 423, 425, 427 may function in a number of ways such as forming shorts between the electrical paths or the interconnect paths may also function as electrical paths.

The measurement paths R1, R2, R3, R4, R5, R6, R7, R8, R9, R10 may be segments of the electrical paths. Further, the measurement paths may be segments of electrical paths located approximately between the intersection points of the interconnect paths with the electrical paths. A measurement path may also be a segment of an electrical path located between a test node and the intersecting point of an interconnect path and an electrical path or may also have a test node at each end. In another example, a test path may be comprised of measurement paths, R3, R4 and R5. Measurement path R3 may be a segment of electrical path 492 located between test node 404 and the intersection point of interconnect path 425 with electrical path 492. Measurement path R4 may be a segment of electrical path 492 located between the intersection point of interconnect path 425 with the electrical path 492 and the intersection point of interconnect path 423 with the electrical path 492. Measurement path R5 may be similarly described.

In conventional test systems, if the number of test nodes is n, the number of measured test paths is 0.5n. In this example, omitting interconnect paths 423, 425, 427 the number of test nodes will be twice the number of test paths. A first test path may be located between test nodes 402 and 412, a second test path may be located between test nodes 404 and 414, a third test path may be located between test nodes 406 and 416 and a fourth test path may be located between test nodes 408 and 418. In this example, there are eight test nodes and four possible test paths. Due to the lack of interconnect paths in this specific example, there are only four ways to electrically connect one node to another node. Further, the test paths are the same as the electrical test paths 490, 492, 494, 496.

In another example, using embodiment 400 as shown, including the interconnect paths 423, 425, 427, the number of possible test paths is greater than half the number of test nodes. In FIG. 4, there are eight test nodes but more than four possible test paths. Starting at test node 402, it is possible to connect to test nodes 412, 414, 416, 418, 404, 406, 408. Starting at test node 404, it is possible to connect to test nodes 412, 414, 416, 418, 402, 406, 408. Similarly, starting at test nodes 406 it is possible to connect to test nodes 412, 414, 416, 418, 402, 404, 408 and by starting at 408 it is possible to connect to test nodes 412, 414, 416, 418, 402, 404, 406. Thus, the number of test paths is greater than half the number of test nodes in the test system due to the interconnect paths connecting the electrical paths. In one example, the system may have n test nodes and the interconnect paths may be acting as shorts between the electrical paths. By using the interconnect paths as shorts to electrically connect the electrical paths, the number of measurement paths may increase to approximately (1.5n−2). Thus, approximately (1.5n−2) measurement paths may have the resistance uniquely measured.

FIG. 4 demonstrates one way the interconnect paths may electrically connect the electrical paths. By electrically connecting the electrical paths, it is possible to increase the number of test paths without increasing the number of test nodes. The greater number of test paths yields a greater amount of data, thus allowing the determination of electrical values for measurement paths that were not individually or directly measured. By determining these electrical values it becomes possible to isolate which interposer interface connection or set of interposer interface connections may have caused the fault or faults in the assembly. As discussed with respect to FIG. 3, the number of test paths where the interconnect paths behave as electrical paths, tracing between the printed circuit board and test package, increases the possible number of test paths for measurement without increasing the number of test nodes. In another example, the system may have n test nodes and the interconnect paths may be acting as electrical paths. By using the interconnect paths that behave as electrical paths (resistance or other electrical characteristics may be measured or determined for the interconnect paths), the number of measurement paths may increase to approximately (2n−3). Accordingly, approximately (2n−3) measurement paths may have the resistance uniquely measured.

Figure 5:
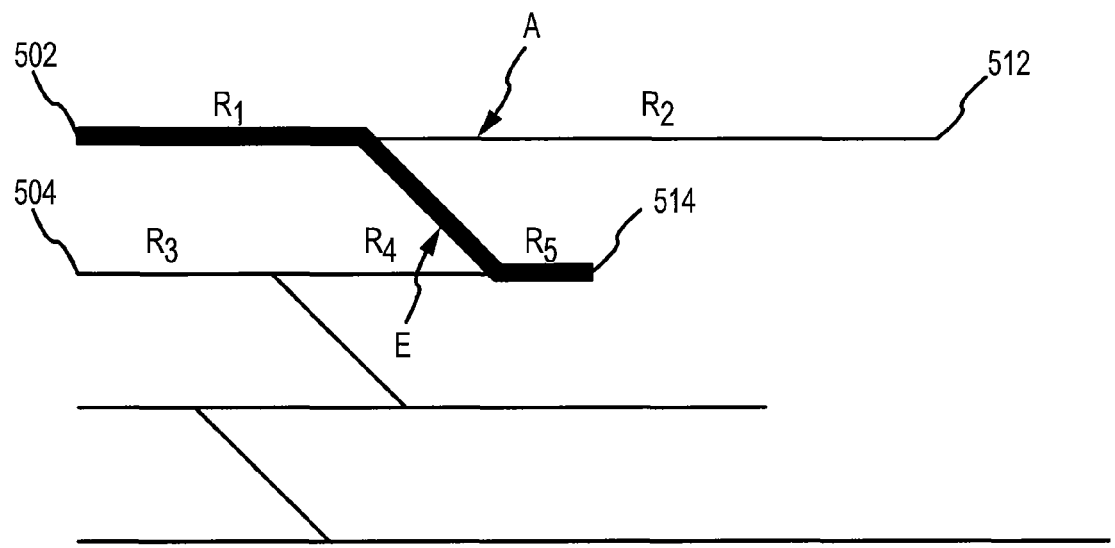
FIG. 5 depicts an exemplary embodiment of a matrix corresponding to a system of linear equations.

FIG. 5 depicts an exemplary embodiment of a matrix corresponding to a system of linear equations. In FIG. 5, multiple test nodes, measurement paths, interconnect paths, electrical paths and test paths may be included in a daisy chain layout as demonstrated in FIG. 4. In FIG. 5, the test paths may be represented by multiple measurement paths. Additionally, a system of linear equations may be used to represent the test paths in a daisy chain layout. Thus, the test paths may also be represented in a matrix of coefficients. For example, in FIG. 5, test path A may connect test node 502 to test node 512. The resulting equation for test path A may be expressed:

$$A=R1+R2$$

where R1 and R2 are both measurement paths of the embodiment 500. Furthermore, the test path E may connect test node 502 to test node 514. Test path E is represented in FIG. 5 in bold lines. The resulting equation for test path E may be expressed:

$$E=R1+R5$$

Thus the following system of equations may result, which encompass ten distinct test paths, including test paths A and E:

$$A=R1+R2$$

$$B=R3+R4+R5$$

$$C=R6+R7+R8$$

$$D=R9+R10$$

$$E=R1+R5$$

$$F=R1+R4+R8$$

$$G=R1+R4+R7+R10$$

$$H=R3+R4+R2$$

$$I=R3+R8$$

$$J=R3+R7+R10$$

The system of linear equations set forth above may represent various possible test paths of embodiment 500. However, the system of ten equations is for exemplary purposes only as numerous additional equations are also possible. Further, the ten equations set forth above may be combined to form a system of equations 510 that represents the test paths of embodiment 500. Using the above system of equations, a matrix of coefficients may be established. For purposes of explanation the matrix of coefficients may be called Matrix X. The matrix of coefficients, Matrix X, may be represented as the following:

$$x = \begin{pmatrix} 1 & 1 & 0 & 0 & 0 & 0 & 0 & 0 & 0 & 0 \\ 0 & 0 & 1 & 1 & 1 & 0 & 0 & 0 & 0 & 0 \\ 0 & 0 & 0 & 0 & 0 & 1 & 1 & 1 & 0 & 0 \\ 0 & 0 & 0 & 0 & 0 & 0 & 0 & 0 & 1 & 1 \\ 1 & 0 & 0 & 0 & 1 & 0 & 0 & 0 & 0 & 0 \\ 1 & 0 & 0 & 1 & 0 & 0 & 0 & 1 & 0 & 0 \\ 1 & 0 & 0 & 1 & 0 & 0 & 1 & 0 & 0 & 1 \\ 0 & 1 & 1 & 1 & 0 & 0 & 0 & 0 & 0 & 0 \\ 0 & 0 & 1 & 0 & 0 & 0 & 0 & 1 & 0 & 0 \\ 0 & 0 & 1 & 0 & 0 & 0 & 1 & 0 & 0 & 1 \end{pmatrix}$$

Once the matrix of coefficients, Matrix X, has been established, then measurements, such as resistance measurements, of the test paths represented in the matrix of coefficients, Matrix X, may be taken. The measurements may include, but are not limited to resistance, impedance, current and so on. These measurements may be represented in another matrix of measured resistance values. For purposes of explanation, the matrix of measured resistance values may be called Matrix B. Matrix X and Matrix B may be used to solve for a third matrix of unknown resistances. For the purposes of explanation, the third matrix of unknown resistances may be called Matrix R. The resistances in Matrix R may be the resistance values for measurement paths not directly measured. One way to solve for Matrix R may be using linear algebra using the following equation for matrices:

$$B=(X)(R)$$

Matrix R may be solved by using the following equation solved for R:

$$R=(X^{-1})(B)$$

The resistance values of Matrix R correspond to the values of the individual measurement paths. For example, Matrix R may be solved for values R1, R2, R3 and so on, through R0. The value R1 corresponds to the value of R1 in the equation of A=R1+R2. Similarly, the values R2, R3 and so on correspond to the values in the set of ten linear equations set forth above. Thus, it may be possible to uniquely solve for each measurement path.

The ability to solve for each individual measurement path resistance, enables the monitoring of the individual measurement path resistance values for change or for purposes of characterization. For example, the test paths may be monitored for changes in resistance values. If the resistance value for one of the test paths changes, because it is possible to solve for each of the measurement paths that comprise the test path, the fault may be isolated to a measurement path. The fault may not otherwise be locatable by simply measuring electrical paths with no interconnect paths. Accordingly, the fault may be associated with an individual interposer interface connection or a set of interface connections.

The use of interconnect paths may increase the number of test paths, thus the number of equations may be greater then the number of unknown variables. Accordingly, as the number of test paths increases, confidence in the calculated values may increase and a better estimate of the uncertainty of the calculated or solved values may result. Stated differently, with an increased number of test paths, it is possible to improve the accuracy of the determined terms, to estimate the uncertainty in the solved terms and the increased number of test paths can be used both to improve the accuracy of the solved terms and to estimate the uncertainty of the value of the solved terms. The least squares method may be used to improve the accuracy of the solved terms and to gain a better estimate of the uncertainty of the value of the solved terms. Additionally, in one example, FIG. 5 includes ten unknown values, thus a system of at least ten equations could be generated to solve for the ten unknown values. However, it is possible to generate more then ten equations from the test system in FIG. 5. After solving for the ten unknown values using the ten equations in a linear system, the ten values may then be used in an additional generated equation, for example an eleventh equation, beyond the ten original equations. It is then possible to measure the eleventh equation and to solve for the eleventh equation using some of the values of the ten originally solved for values. The two sides of the eleventh equation, the measured value and the solved value, may not equal each other, however the difference in the values may give an estimate of the uncertainty of the calculated values.

Figure 6:
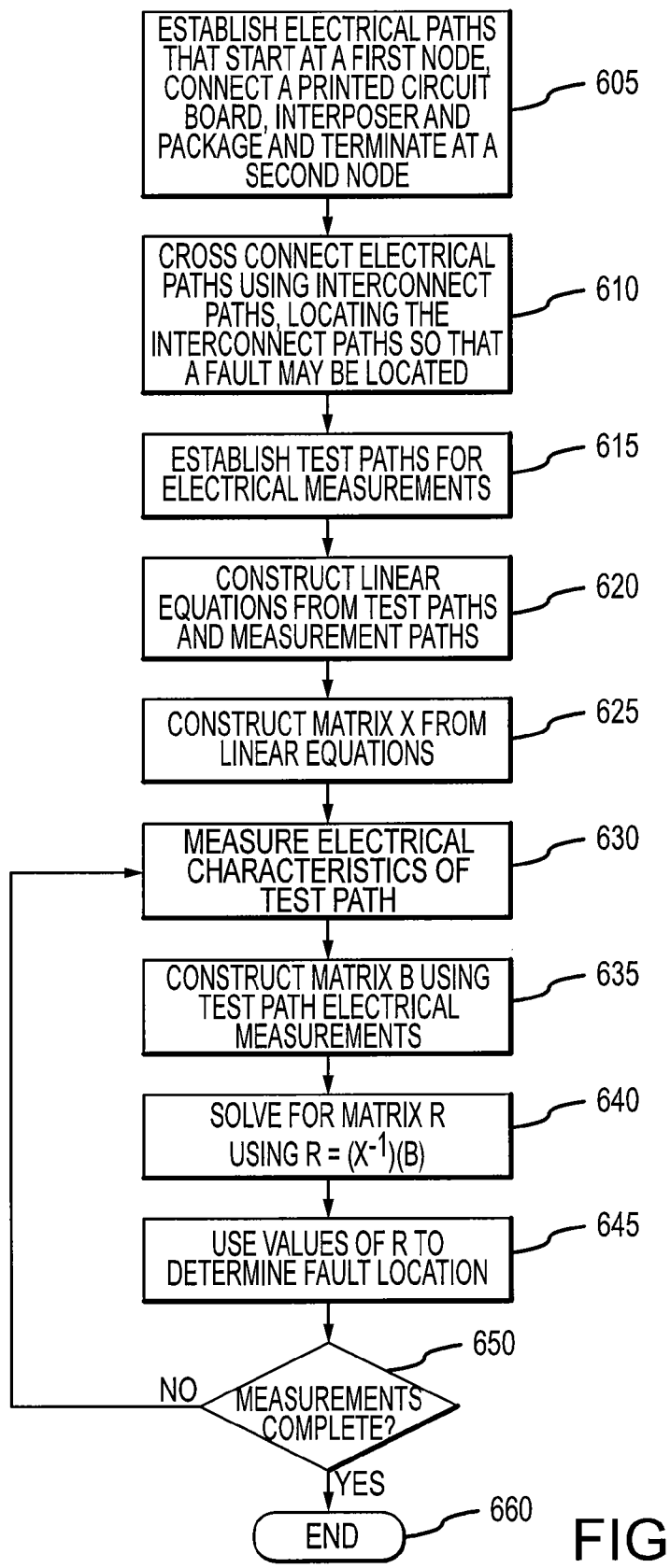
FIG. 6 depicts an exemplary embodiment of a flow chart.

FIG. 6 depicts an exemplary method flow chart 600 of the present invention. The flow chart 600 begins with block 605, the operation of establishing electrical paths. The electrical paths start at a first node, connect a printed circuit board, interposer and package and terminate at a second node. The electrical paths may be chosen according to the interposer interface connections that need to be measured or monitored. The likelihood of detecting a degraded interface increases as more interposer connections are measured or monitored.

In the operation of block 610, the electrical test paths may be cross connected using interconnect paths. The interconnect paths are located so that the likelihood of locating a fault is increased. For example, when an electrical path connects several interposer interface connections, each interconnect path is located at a point on the electrical path so that only one interposer interface connection is between each interconnect path point. The interconnect paths may electrically connect the electrical test paths (the interconnect paths may function as shorts between the electrical test paths) and the interconnect paths may also function as electrical test paths.

In the operation of block 615, test paths may be established for measuring an electrical quantity, such as resistance. The test paths in block 615 may be established so that the electrical paths and interconnect paths are connected such that linear equations may be generated from the system. In block 620, linear equations are constructed from the test paths and the measurement paths. Next in block 625, Matrix X is constructed from the linear equations formed in block 620 from the test paths and the measurement paths.

The next operation in block 630 is measuring an electrical characteristic of the test paths. In block 635, Matrix B may be constructed using the electrical characteristic measurements of the test paths. In block 640, the following equation:

$$R=(X^{-1})(B)$$

may be used to solve for individual measurement path electrical characteristic measurements.

In the operation of block 645, the values of Matrix R may be used to determine a fault location. Then, in block 650, the decision of whether more measurements may be taken is set forth. If the determination is made to take more measurements, then the flow chart may loop back to operation 630 and the electrical characteristics of the test paths are measured again. Thus, the operations of 630 through 650 may be iterative operations. If the determination is made to not take more measurements, then the flow chart proceeds to operation 660, or the process is complete. The electrical characteristic measurements may be monitored for characterization purposes or for changes in value (the change between an initial value and a second value, or any value thereafter, or the change between any values thereof) that may indicate a manufacturing defect or degrading interface. Because the electrical characteristic value may be determined for individual measurement paths not otherwise directly measurable, the location of the fault may also be determined. Accordingly, if an interposer interface connection or set of connections caused the fault then the specific interposer interface connection or set of connections may be located.

Although the present invention has been described with respect to particular apparatuses, configurations, components, systems and methods of operation, it will be appreciated by those of ordinary skill in the art upon reading this disclosure that certain changes or modifications to the embodiments and/or their operations, as described herein, may be made without departing from the spirit or scope of the invention. Accordingly, the proper scope of the invention is defined by the appended claims. The various embodiments, operations, components and configurations disclosed herein are generally exemplary rather than limiting in scope.

The invention claimed is:

1. A system for testing electrical assemblies comprising:
a printed circuit board;
a package;
a plurality of electrical connections, the plurality of electrical connections electrically connecting the printed circuit board to the package;
a set of electrical paths providing electrical communication between the printed circuit board and the package, the set of electrical paths including at least a first electrical path and a second electrical path;
a set of interconnect paths electrically connecting individual paths of the set of electrical paths, the set of interconnect paths including at least one interconnect path electrically connecting the first electrical path and the second electrical path such that the first electrical path includes at least two first electrical path segments and the second electrical path includes at least two second electrical path segments; and
a test platform configured to associate a linear equation variable with each of the at least two first electrical path segments, each of the at least two second electrical path segments, and the at least one interconnect path, the test platform further configured to employ a plurality of linear equations using the linear equation variables to identify a value for each of the least two first electrical path segments, each of the at least two second electrical path segments, and the interconnect path.

2. The system of claim 1 wherein the at least one interconnect path comprises a short circuit interconnection between the first electrical path and the second electrical path.

3. The system of claim 1 further comprising test equipment configured to apply electrical signals to the first electrical path, the second electrical path, and a combination of the first electrical path, the second electrical path and the at least one interconnect path such that a fault in the first electrical path or second electrical path is identified.

4. The system of claim 3 wherein the identified fault cannot be located by applying an electrical signal to one of either the first electrical path, the second electrical path, or both.

5. The system of claim 3 wherein:
the first electrical path includes a first electrical segment including a first portion of the first electrical path and an intersection of the first electrical path with the interconnection path, the first electrical path includes a second electrical segment including a second portion of the first electrical path and the intersection of the first electrical path with the interconnection path; and
the second electrical path includes a third electrical segment including a portion of the second path and a second intersection of the second path with the interconnection path, the second electrical path includes a fourth electrical segment including a second portion of the second path and the second intersection of the second path with the interconnection path;
whereby a fault is isolated to one of the first segment, the second segment, the third segment and the fourth segment and the fault cannot be located by direct measurement of the first electrical path or the second electrical path.

6. The system of claim 5 wherein an identified fault location corresponds to one interface connection of the plurality of interface connections.

7. The system of claim 1 further comprising test equipment configured to apply electrical signals to the first electrical path, the second electrical path, and a combination of the first electrical path, the second electrical path and the at least one interconnect path to obtain electrical properties of the electrical paths.

8. The system of claim 1 wherein the package is a daisy chain package, the daisy chain package defining the set of interconnect paths.

9. The system of claim 8 further comprising an interposer located between the printed circuit board and the daisy chain package, wherein the set of electrical paths provide electrical communication between the printed circuit board, the interposer, and the daisy chain package.

10. The system of claim 1 wherein at least one of the first electrical path, the second electrical path and the interconnect path includes at least one electrical component.

11. The system of claim 10 wherein the printed circuit board includes the at least one electrical component.

12. The system of claim 1 wherein the first electrical path and the second electrical path of the set of electrical paths are electrically isolated from each other, aside from the interconnect path electrically connecting the first electrical path to the second electrical path.

13. A method of testing an electrical system comprising:
providing a printed circuit board;
providing a package;
providing a plurality of electrical connections, the plurality of electrical connections electrically connecting the printed circuit board to the package;
providing a set of electrical paths providing electrical communication between the printed circuit board and the package, the set of electrical paths including at least a first electrical path and a second electrical path;
providing a set of interconnect paths electrically connecting individual paths of the set of electrical paths, the set of interconnect paths including at least one interconnect path electrically interconnecting the first electrical path and the second electrical path such that the first electrical path includes at least two first electrical path segments and the second electrical path includes at least two second electrical path segments; and
providing a test platform configured to associate a linear equation variable with each of the at least two first electrical path segments, each of the at least two second electrical path segments, and the at least one interconnect path, the test platform further configured to employ a plurality of linear equations using the linear equation variables to identify a value for each of the least two first electrical path segments, each of the at least two second electrical path segments, and the interconnect path.

14. The method of claim 13 further comprising determining an electrical value of the interconnect path.

15. The method of claim 13 further comprising electrically connecting an electrical component to at least one electrical path of the set of electrical paths.

16. The method of claim 13 further comprising test equipment configured to apply electrical signals to the first electrical path, the second electrical path, and a combination of the first electrical path, the second electrical path and the at least one interconnect path such that a fault in the first electrical path or second electrical path is identified.

17. The method of claim 16 wherein the identified fault cannot be located by applying an electrical signal to one of either the first electrical path, the second electrical path, or both.

18. The method of claim 16 wherein:

the first electrical path includes a first electrical segment including a first portion of the first electrical path and an intersection of the first electrical path with the interconnection path, the first electrical path includes a second electrical segment including a second portion of the first electrical path and the intersection of the first electrical path with the interconnection path; and the second electrical path includes a third electrical segment including a portion of the second path and a second intersection of the second path with the interconnection path, the second electrical path includes a fourth electrical segment including a second portion of the second path and the second intersection of the second path with the interconnection path;

whereby a fault is located in one of the first segment, the second segment, the third segment and the fourth segment and such fault cannot be located by direct measurement of the first path or the second path.

19. The method of claim 18 wherein the identified fault location is determined to correspond to one interface connection of the plurality of interface connections.

20. The method of claim 13 wherein the first electrical path and the second electrical path of the set of electrical paths are electrically isolated from each other, aside from the interconnect path electrically connecting the first electrical path to the second electrical path.

* * * * *